United States Patent
Johnson

(10) Patent No.: US 10,162,035 B2
(45) Date of Patent: Dec. 25, 2018

(54) SYSTEM AND METHOD FOR CONTROLLING MOTION EFFECTS IN MAGNETIC RESONANCE IMAGING (MRI) IMAGES

(71) Applicant: Wisconsin Alumni Research Foundation, Madison, WI (US)

(72) Inventor: Kevin M. Johnson, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 949 days.

(21) Appl. No.: 14/626,275

(22) Filed: Feb. 19, 2015

(65) Prior Publication Data

US 2016/0245890 A1   Aug. 25, 2016

(51) Int. Cl.
G01R 33/565 (2006.01)
G01R 33/56 (2006.01)
G01R 33/563 (2006.01)
G01R 33/48 (2006.01)
G01R 33/483 (2006.01)
G01R 33/567 (2006.01)

(52) U.S. Cl.
CPC .... G01R 33/56509 (2013.01); *G01R 33/4818* (2013.01); *G01R 33/4822* (2013.01); *G01R 33/4824* (2013.01); *G01R 33/4835* (2013.01); *G01R 33/5601* (2013.01); *G01R 33/5635* (2013.01); *G01R 33/5673* (2013.01)

(58) Field of Classification Search
CPC ............ G01R 33/4818; G01R 33/4822; G01R 33/4824; G01R 33/4835; G01R 33/5601; G01R 33/5635; G01R 33/56509; G01R 33/5673

USPC .................................................. 324/307–309
See application file for complete search history.

(56) References Cited

U.S. PATENT DOCUMENTS

| 4,760,338 A | * | 7/1988 | Kose .................... G01R 33/446 324/307 |
| 2015/0192653 A1 | * | 7/2015 | Sharif .................... A61B 5/055 600/420 |

OTHER PUBLICATIONS

Brodsky, Ethan K., et al. "High-spatial and high-temporal resolution dynamic contrast-enhanced perfusion imaging of the liver with time-resolved three-dimensional radial MRI." Magnetic resonance in medicine 71.3 (2014): 934-941.*

(Continued)

*Primary Examiner* — Rishi Patel
(74) *Attorney, Agent, or Firm* — Quarles & Brady LLP

(57) ABSTRACT

A system and method for generating magnetic resonance imaging (MRI) images is provided. The MRI system is directed to perform the dynamic contrast enhanced imaging study of the subject by exciting a two-dimensional (2D) slice within a portion of a field of view (FOV) of the MRI system and acquiring imaging data from the 2D slice by sampling k-space in a pseudorandom manner using sampling trajectories extending between a center of k-space and peripheral areas of k-space. Thereafter, the 2D slice is slid to another portion of the FOV at a velocity selected to be greater a velocity of the motion of the subject and the process is repeated for each of a plurality of 2D slices to create images of the subject where artifacts induced by the motion of the subject are reflected as geometric distortions.

20 Claims, 5 Drawing Sheets

(56) References Cited

OTHER PUBLICATIONS

Brodsky, et al., High Spatial and High Temporal Resolution Dynamic Contrast-Enhanced Pertusion Imaging of the Liver with Time-Resolved 3D-Radial MRI, Magn Reson Med. Mar. 2014; 71(3): 934-941.

* cited by examiner

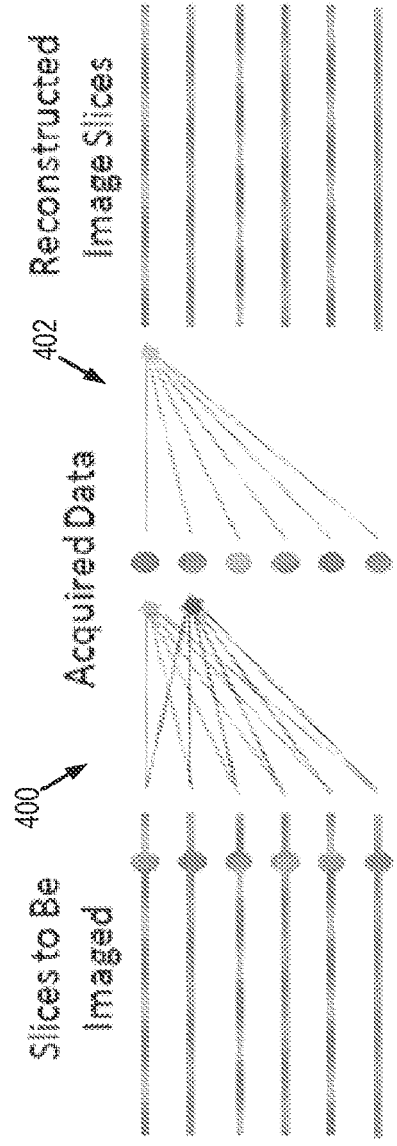
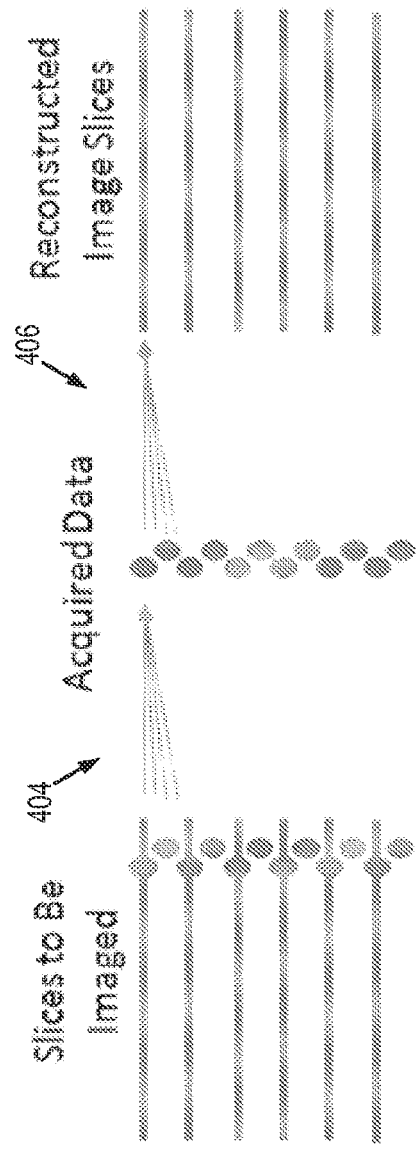
Fig. 4A
Fig. 4B

US 10,162,035 B2

SYSTEM AND METHOD FOR CONTROLLING MOTION EFFECTS IN MAGNETIC RESONANCE IMAGING (MRI) IMAGES

STATEMENT REGARDING FEDERALLY SPONSORED RESEARCH

This invention was made with government support under DK096169 awarded by the National Institutes of Health. The government has certain rights in the invention.

BACKGROUND

Compared to other imaging modalities such as computed tomography and ultrasound, magnetic resonance imaging (MRI) is relatively more sensitive to motion due to the longer scan time in MRI. One of the major sources of motion is respiration.

Respiratory motion greatly affects MRI imaging of abdominal organs, especially in the presence of blood flow. On the other hand, there is a need to image vascular structures and blood flow or perfusion in the abdominal organs, such as the liver, using MRI because MRI is non-invasive and produces high image quality. For example, in macroscale, angiography is needed to study liver macro vasculature to examine liver transplant patency and portal flow changes during liver fibrosis. As another example, in microscale, microvasculature, such as perfusion, is needed to evaluate liver cancers and early response to anti-angiogenic agents.

Unfortunately, respiratory motion can be quite extensive in the abdomen. In addition, motion effects are often exacerbated in patients with diseases that alter their respiratory breathing pattern or that limit the patient's ability to hold their breath. Of course, patients with such limiting pathologies are often a large portion of the population that benefits from such imaging.

It would therefore be highly desirable to provide a method for generating MRI images that are less sensitive to motion.

SUMMARY

The present disclosure provides systems and methods that overcome the aforementioned drawbacks by controlling motion effects on MRI images. This may be accomplished using a sliding slice acquisition strategy that samples k-space in a pseudorandom manner relative to trajectories extending between the center and peripheral areas of k-space. For example, a 2D slice may be slid from one position to another portion within an overall field of view of an MRI system at a velocity selected to be greater than the velocity of the motion of the subject to create images of the subject where artifacts induced by the motion of the subject, such as respiratory motion, are reflected as geometric distortions. During this time, the k-space sampling of each slice may be pseudorandom, with for example, 2D lines extending from the periphery and center.

In one configuration, a method is provided for generating magnetic resonance imaging (MRI) images. The method includes preparing an MRI system having a defined field of view (FOV) to perform a dynamic contrast enhanced imaging study of a subject during motion of the subject. The method also includes directing the MRI system to perform the dynamic contrast enhanced imaging study by exciting a two-dimensional (2D) slice within a portion of the defined FOV and oriented in a selected direction relative to the motion of the subject, acquiring imaging data from the 2D slice by sampling k-space in a pseudorandom manner using sampling trajectories extending between a center of k-space and peripheral areas of k-space, and sliding the 2D slice to another portion of the defined FOV at a velocity selected to be greater than a velocity of the motion of the subject. This process is repeated for each of a plurality of 2D slices and the imaging data is reconstructed to form at least one image of the subject.

In one configuration, a MRI system is provided. The system includes a magnet system configured to generate a polarizing magnetic field about a field of view (FOV) of the MRI system that receives a subject having received a dose of a contrast agent. The system also includes gradient coils configured to establish at least one magnetic gradient field to the polarizing magnetic field and a radio frequency (RF) system configured to apply an RF field to the subject and to receive magnetic resonance signals therefrom. The system further includes a computer system programmed to direct the RF system and the gradient coils to excite a slice; and sample k-space to acquire k-space data in a pseudorandom manner and with a sampling trajectory of extending from center of k-space to peripheral areas of the k-space. The computer is programmed to repeat this for each of a number of sliding slices and reconstruct at least one MRI image from the k-space data that spans a portion of the subject showing contrast dynamics spanning the number of sliding slices.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A is a graphic illustration of sources of acquired data and reconstructed image slices for a three-dimensional Fourier Cartesian acquisition.

FIG. 4B is a graphic illustration of sources of acquired data and reconstructed image slices for a sliding slice acquisition in accordance with the present disclosure.

DETAILED DESCRIPTION OF THE INVENTION

Figure 1:
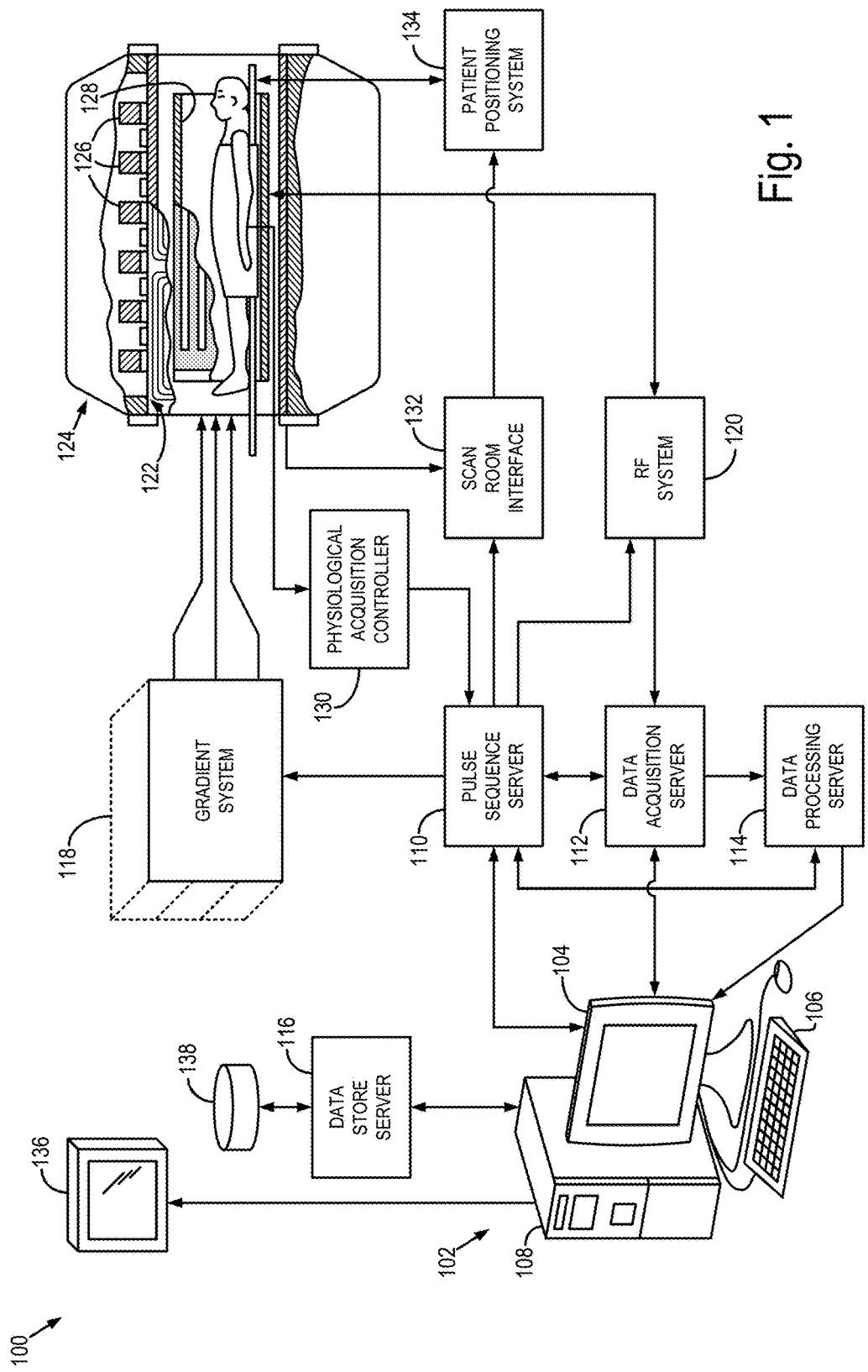
FIG. 1 is a block diagram of an example of a magnetic resonance imaging ("MRI") system configured in accordance with the present disclosure.

Referring particularly now to FIG. 1, an example of a magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radio frequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF preamplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (1);$$

and the phase of the received MR signal may also be determined:

$$\varphi = \tan^{-1}\left(\frac{Q}{I}\right). \quad (2)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data are lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data are acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

As described above, respiratory motion greatly limits MRI of, for example, abdominal organs. Breath-held and respiratory gating acquisition can be used in attempt to minimize the motion effects. However, in dynamic contrast enhanced (DCE) imaging, dynamic responses to contrast agents for different tissue vary drastically. Some tissue has long dynamic span that DCE imaging cannot be completed within one single breath hold.

The challenges from the long dynamic span are especially prominent in MRI of liver. Contrast agent arrives at the hepatic artery early, then portal vein, lastly the liver tissue. DCE imaging of liver requires one to collect images over a span of 30-90 seconds to capture the dynamic responses of the entire liver. Thus, breath-held or respiratory gated approaches yield data with significant gaps in time that may not coordinate with contrast dynamics.

Figure 3A:
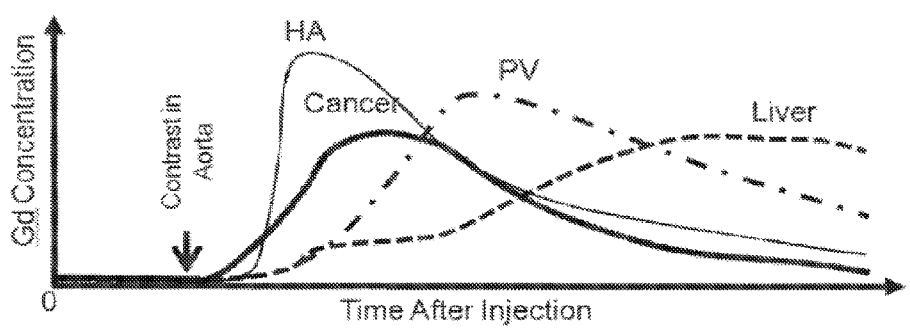
FIG. 3A is an example of dynamic response to a contrast agent in various parts of liver.

Referring now to FIG. 3A, the concentration of a contrast agent in various parts of liver at various times after injection of the contrast agent is provided. Contrast agent arrives at different tissue—cancer, the thick line; hepatic artery (HA), the thin line; portal vein (PV), the dot-dash line; liver tissue, the dashed line—at different times and with different dynamic profiles and spans. Compared to cancer, HA, and PV, the contrast agent reaches the peak concentration in liver tissue much later, but remain in there much longer. If the entire liver is imaged with breath-held or respiratory gating to minimize the effects of motion, it will take more than one breath to cover the entire dynamic range as shown in FIG. 3A. This results in gaps in the acquired dynamic images during the breathing periods 314.

In addition to motion and long dynamic span, DCE imaging of liver is challenging for two more reasons. First, large image volume is required to scan the entire abdominal region of liver. In this large volume, tissue is heterogeneous and MRI images are also affected by inflow. Second, tumors can be small and hard to distinguish from other structures when the images are plagued with artifacts, especially problematic when large fields of view are needed to capture the entire anatomy. Other methods have been used in an attempt to image a large volume, such as moving table acquisitions, in both stepwise or continuous fashions. However, stepwise-moving table acquisition are slow and prone to stair-step artifacts and continuously-moving table acquisitions are prone to motion artifacts.

Figure 2:
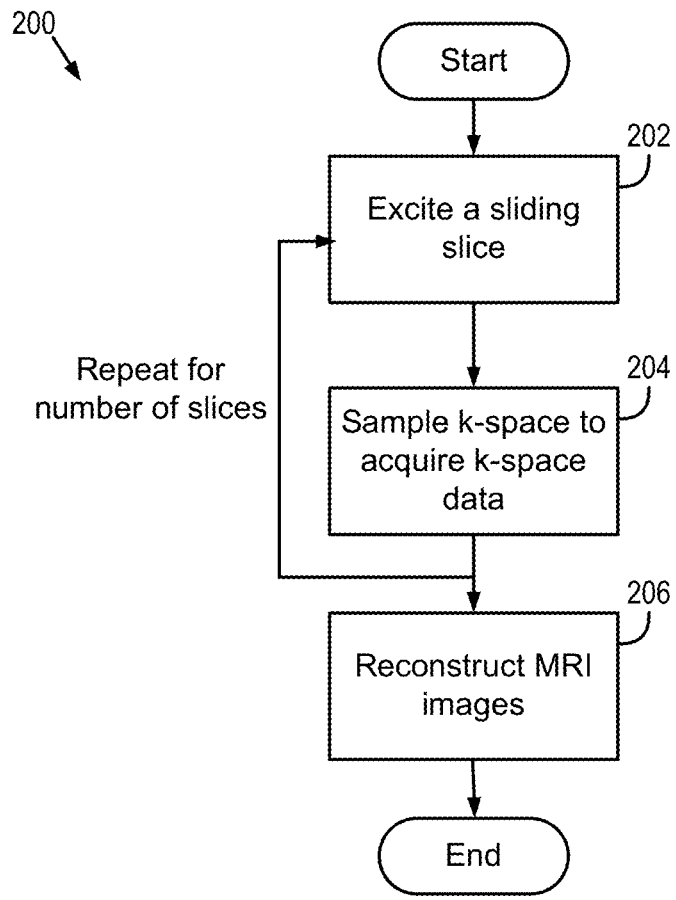
FIG. 2 is a flowchart setting forth example steps of a method for generating MRI images implemented in accordance with the present disclosure.

The systems and methods disclosed herein can control the effects of motion on DCE imaging of abdominal regions. Referring now to FIG. 2, a flowchart 200 is provided that provides some non-limiting steps that may be used with the systems and methods disclosed herein. In particular, at step 202, the MRI system may be used to direct its RF system and gradient coil, such as $G_z$, to excite a two-dimensional (2D) slice, that, as will be described, is a "sliding slice." In step 204, the MRI system directs the gradient coils, such as $G_x$ and $G_y$ in this non-limiting example, to sample k-space in order to acquire k-space data. As will be further described, k-space may be sampled in a pseudorandom manner with a sampling trajectory extending between the center of k-space and the peripheral areas of k-space. Steps 202 and 204 are repeated for a number of slices that are slid over the desired field of view (FOV) of the MRI system to cover the entire imaging volume or FOV. As will be described, acquisition planning may include determining a speed and direction of a physiological cycle of the subjecting being imaged. This information is then used to control sensitivity to motion artifacts such that the velocity of the motion is lower than that of the sliding. By doing so, motion artifacts are further controlled.

In step 206, MRI images are reconstructed using the acquired k-space data. In one configuration, the acquired k-space data may be reconstructed in a least square sense on an oversampled 3D grid with resampling operations in all three dimensions, where resampling kernel in the sliding dimension matches expected excitation profile.

As will be described, the images to corresponding to each of the slices can be used to create an image of the desired FOV or imaging volume where artifacts induced by the motion of the subject are reflected as geometric distortions within the images. Such geometric distortions are substantially less limiting on the clinical value than traditional blurring or ghosting artifacts created by motion using traditional imaging systems and methods.

Besides controlling motion effects, the sliding slice acquisition technique disclosed herein can be used to image a large volume efficiently. In the above-described sliding slice acquisition, the table is stationary. So there is no need to compensate or account for issues associated with moving tables. Furthermore, the direction of sliding is flexible and can be adapted to suit the application of interest. With the sliding slice acquisition, breath held or respiratory gating is not required, but may be used, and data covering the entire dynamic range shown in FIG. 3(A) can be acquired without gaps in the breathing periods 314.

Figure 3B:
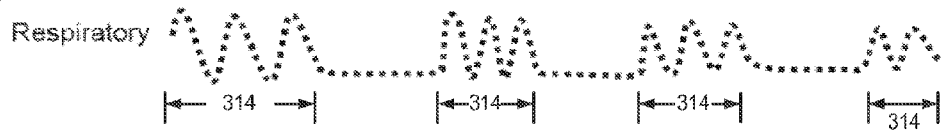
FIG. 3B is a pulse sequence for use with the MRI system of FIG. 1 to acquire data using a sliding slice with a radial sampling trajectory in k-space.
Figure 3C:
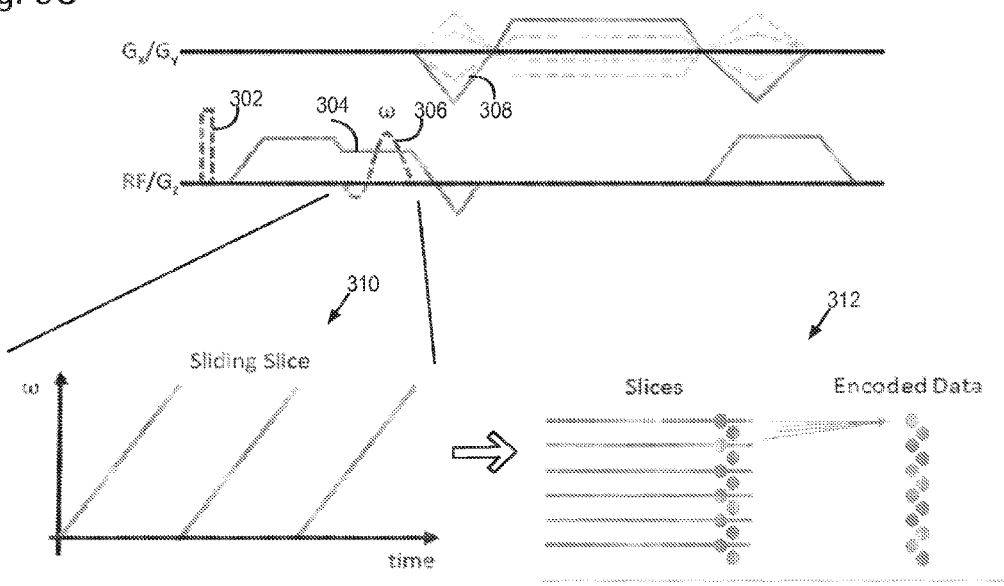
FIG. 3C is a graphic illustration of a sliding slice acquisition.

Referring now to FIG. 3B, an example pulse sequence for sliding slice acquisition is provided. The MRI system directs its RF and gradient coils to generate RF pulses and gradients shown in FIG. 3B. RF pulse 306 and $G_z$ gradient 304 selects a sliding slice.

In one configuration, data are collected with the excitation frequency of RF pulse 306 linearly varying over each time frame 310 such that the slice is swept in the slice-selection direction, achieving contiguous volumetric coverage 312. Compared to two dimensional Cartesian acquisition, sliding slice acquisition can be used to cover the volume contiguously and without confounding artifacts due to motion and mis-registration of slices.

Further advantages of the above-described sliding slice acquisition over three-dimensional (3D) Cartesian acquisition are illustrated with respect to FIGS. 4A and 4B. In particular, FIGS. 4A and 4B provide a comparison of 3D Fourier Cartesian acquisition and the sliding slice acquisition as disclosed herein. Each line in the slices to be imaged and the reconstructed image slices represents an imaging slice as if the imaging slice is going perpendicularly in or out of the displaying plane of the figure. In FIG. 4A, k-space data is acquired by 3D Fourier Cartesian sampling. Each acquired data from k-space includes information from all slices as illustrated at 400. As such, information from the acquired data is used to reconstruct one slice of the image, as illustrated at 402. So information in each slice is permeated to all other slices after 3D Fourier Cartesian sampling and reconstruction. That is why the artifacts of local motion can plague multiple slices acquired with 3D Fourier Cartesian sampling and render images clinically unusable due to blurring and ghosting artifacts.

In contrast, the potential for motion can be constrained to local slice using the sliding slice acquisition described above and, thereby, provide more clinically valuable images in the face of subject motion, such as reparatory motion. Referring to FIG. 4B, only one sliding slice is excited and acquired, as illustrated at 404. As a result, each acquired data includes information only from one of the sliding slices, as illustrated at 406. Again, because only one sliding slice is excited and acquired, the reconstructed image from the acquired data only includes information from this sliding slice as shown in FIG. 4B. Thus, with the sliding slice acquisition, motion effects can be constrained to a particular slice or local area, and do not plague all images.

In Fourier encoding, artifacts from motion manifest as destructive ghosting and blurring due to the non-local nature of Fourier transform. In the dynamic sliding slice approach described above, artifacts manifest as geometric distortions. But the geometric distortions in the sliding slice approach are not readily visible and/or do not degrade the clinical utility of the images. The sliding approach may also be rendered notably less sensitive to inflow by use of the above-described saturation pulse 302, or other such techniques. Thus, the effects of motion on MRI images are controlled with sliding slice acquisition.

To further control the motion effects, k-space can be sampled along a sampling trajectory extending between the center of k-space and the peripheral areas of k-space. As one non-limiting example, this sampling may be achieved using a radial sampling strategy. Referring again to FIG. 3B, $G_x$ and $G_y$ gradients 308 may be used to sample k-space in a radial trajectory extending from the center of the k-space to the peripheral areas of the k-space. As another non-limiting example, a variable density Cartesian sampling method may be used to sample the k-space. Regardless of the particular sampling strategies, it may be advantageous to sample the center of k-space more densely and samples the periphery less densely, such as can be achieved using radial and variable-density Cartesian sampling. With such acquisitions, motion during acquisition can be averaged at the more densely sampled center of k-space. Consequently, motion effects are controlled in the acquired data and therefore in the reconstructed images.

Figure 5B:
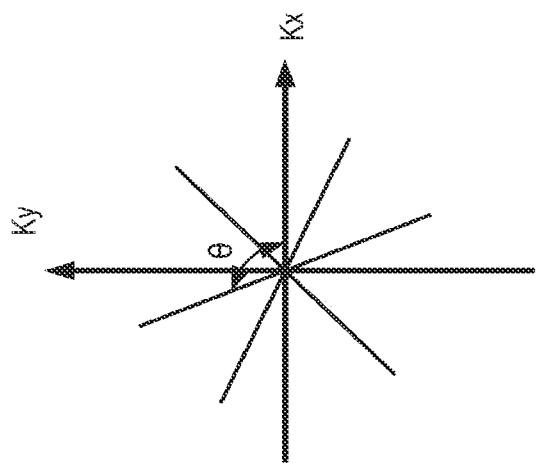
FIG. 5B illustrates the angle of the sampling trajectory in FIG. 5A at a given time.
Figure 5A:
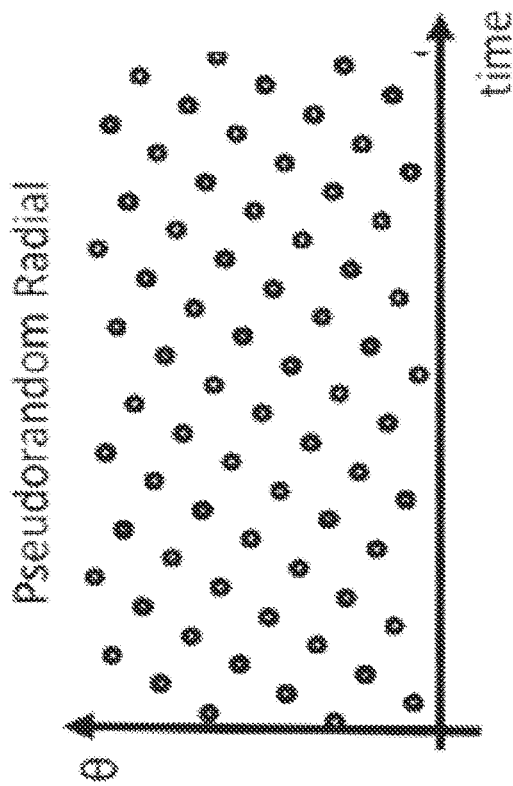
FIG. 5A illustrates an example k-space sampling strategy that the k-space is sampled in a pseudorandom manner and with a sampling trajectory extending from the center of the k-space to the peripheral areas of the k-space.

One more way to further control the motion effects is to sample k-space in a pseudorandom manner during the sweep of k-space. In one configuration, golden angle radial sampling is used. Referring to FIG. 5A, this k-space sampling is depicted. Angle θ is the angle of the radial line of the k-space trajectory relative to the $k_x$ axis. The angle θ versus time is plotted in FIG. 5B. As the angle θ increments with the golden angle (111.246°), the k-space is sampled by radial lines in a pseudorandom manner (FIG. 5A). For the next frame, the excitation frequency is reset, but the golden angle sampling continues such that each time frame has unique sampling patterns.

A golden-angle radial sampling trajectory may used as one non-limiting example. Other pseudorandom k-space acquisitions, such as variable density Cartesian methods, may also be used to sample the k-space in a pseudorandom manner. Both sampling extending between the center and the periphery of k-space and pseudorandom acquisitions can be combined. Additionally, the above-described acquisition techniques can utilize a simultaneous multi-slice acquisition technique to acquire more than one sliding slice at a time. Furthermore, such acquisitions can be combined with parallel imaging, view sharing, compressed sensing techniques, or the like to further decrease scan time.

In one configuration, before slice selection, a non-selective pulse 302 may be applied. In one example, the RF pulse 302 is used to impart a 3D $T_1$ steady state and establish $T_1$ weighting with an optimal flip angle that much smaller than those for imaging and contrast. The RF pulse 302 is also a saturation RF pulse to reduce in-flow effects. This way, the system and method disclosed herein may sample a 3D steady state in two dimension and control severe artifacts from motion and inflowing blood, which are typical in Fourier acquisition.

The system and method disclosed herein advantageously controls sensitivity to motion artifacts when the velocity of the motion is lower than that of the sliding. Given the recent advances in reconstruction and the prospect for further acceleration using dynamic regularization, such a sliding velocity is achievable for DCE imaging.

At various parts of this application, liver is used to as an example to describe the system and method disclosed herein. The system and method disclosed herein may also be used to image other parts of anatomy, such as breast and prostate, where the dynamic spans of responses to contrast agents are long like in liver. This way, the acquired images are insensitive to motion without breath-holding.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for generating magnetic resonance imaging (MRI) images, the steps of the method comprising:
   a) preparing an MRI system having a defined field of view (FOV) to perform a dynamic contrast enhanced imaging study of a subject during motion of the subject;
   b) directing the MRI system to perform the dynamic contrast enhanced imaging study by:
   i) exciting a two-dimensional (2D) slice within a portion of the defined FOV and oriented in a selected direction relative to the motion of the subject;
   ii) acquiring imaging data from the 2D slice by sampling k-space in a pseudorandom manner using sampling trajectories extending between a center of k-space and peripheral areas of k-space;
   iii) sliding the 2D slice to another portion of the defined FOV at a velocity selected to be greater than a velocity of the motion of the subject;
   c) repeating b) for each of a plurality of 2D slices; and
   d) reconstructing the imaging data to form at least one image of the subject.

2. The method as recited in claim 1, wherein b)ii) includes acquiring data weighted to measure perfusion in the subject.

3. The method as recited in claim 1, wherein the motion of the subject is caused by respiration of the subject.

4. The method as recited in claim 1, wherein a) includes creating a timing plan for b) that accounts for movement of contrast agent dynamics and respiratory motion to thereby perform b)i) and b)ii) while the contrast agent washes into the 2D slice and within a predetermined portion of a respiratory cycle of the subject.

5. The method as recited in claim 1, wherein the sampling trajectories are formed as one of radial lines and variable density Cartesian sampling.

6. The method as recited in claim 1, wherein c) includes sweeping the 2D slice from superior to inferior over a contiguous volume coverage within the FOV.

7. The method as recited in claim 6, wherein in-plane k-space samples are collected using golden angle radial sampling.

8. The method as recited in claim 1, wherein i) includes linearly varying an excitation frequency.

9. The method as recited in claim 1, wherein i) includes directing the MRI system to produce a radio frequency pulse that is not slice-selective to saturate inflow blood or impart a three-dimensional (3D) T1 steady state before exciting the 2D slice to acquire the imaging data in ii).

10. A magnetic resonance imaging (MRI) system, comprising:
   a magnet system configured to generate a polarizing magnetic field about a field of view (FOV) of the MRI system that receives a subject having received a dose of a contrast agent;
   gradient coils configured to establish at least one magnetic gradient field to the polarizing magnetic field;
   a radio frequency (RF) system configured to apply an RF field to the subject and to receive magnetic resonance signals therefrom;
   a computer system programmed to:
   a) direct the RF system and the gradient coils to:
   i) excite a slice; and
   ii) sample k-space to acquire k-space data in a pseudorandom manner and with a sampling trajectory of extending from center of k-space to peripheral areas of the k-space and sliding the slice to another portion of the defined FOV at a velocity selected to be greater than a velocity of motion of the subject;

b) repeat step a) for each of a number of sliding slices; and c) reconstruct at least one MRI image from the k-space data that spans a portion of the subject showing contrast dynamics spanning the number of sliding slices.

11. The system as recited in claim 10, wherein the contrast dynamics include perfusion of at least one organ in an abdomen of the subject.

12. The system as recited in claim 10, wherein c) includes reconstructing the at least one MRI image such that artifacts induced by the motion of the subject are reflected as geometric distortions.

13. The system as recited in claim 10, wherein the sampling trajectory is one of a radial line and a variable density Cartesian sampling.

14. The system as recited in claim 10, wherein the computer is further configured to track a physiological cycle of the subject and coordinate i) and ii) within the physiological cycle.

15. The system as recited in claim 10, wherein the sampling trajectory is radial sampling performed in the pseudorandom order and employing a golden-angle.

16. The system as recited in claim 10, wherein i) includes linearly varying an excitation frequency.

17. The system as recited in claim 10, wherein the computer system is further programmed to direct the RF system to produce RF pulse prior to exciting the slice.

18. The system as recited in claim 17, wherein the RF pulse is used to saturate spins flowing into the slice or impart a three-dimensional T1 steady state to the slice.

19. The system as recited in claim 10, wherein the computer system is further programmed to register images associated with each of the number of sliding slices to reconstruct the at least one MRI image showing contrast dynamics spanning the number of sliding slices.

20. The system as recited in claim 10, wherein the computer system is further programmed to coordinate a) relative to a respiratory cycle of the subject.

* * * * *